(12) United States Patent
Fifield

(10) Patent No.: US 8,085,838 B2
(45) Date of Patent: Dec. 27, 2011

(54) RECEIVER HAVING AN ADAPTIVE FILTER AND METHOD OF OPTIMISING THE FILTER

(75) Inventor: Robert Fifield, Redhill (GB)

(73) Assignee: ST-Ericsson SA, Plan-les-Ouates (CH)

( * ) Notice: Subject to any disclaimer, the term of this patent is extended or adjusted under 35 U.S.C. 154(b) by 1314 days.

(21) Appl. No.: 10/157,688

(22) Filed: May 29, 2002

(65) Prior Publication Data

US 2003/0007553 A1    Jan. 9, 2003

(30) Foreign Application Priority Data

Jul. 6, 2001   (GB) .................................. 0116493.8

(51) Int. Cl.
*H03K 5/159*   (2006.01)

(52) U.S. Cl. .......................... 375/229; 375/232; 375/233

(58) Field of Classification Search ........... 375/229–236
See application file for complete search history.

(56) References Cited

U.S. PATENT DOCUMENTS

| | | | |
|---|---|---|---|
| 5,268,927 A | 12/1993 | Dimos et al. | |
| 5,329,587 A | 7/1994 | Morgan et al. | 379/410 |
| 5,355,418 A | 10/1994 | Kelsey et al. | |
| 5,396,299 A | 3/1995 | Greenberg | |
| 5,654,765 A | 8/1997 | Kim | |
| 5,671,168 A * | 9/1997 | Liu et al. | 708/321 |
| 5,825,898 A * | 10/1998 | Marash | 381/92 |
| 6,142,942 A * | 11/2000 | Clark | 600/443 |
| 6,201,843 B1 | 3/2001 | Kingston et al. | |
| 6,222,592 B1 | 4/2001 | Patel | |
| 6,269,093 B1 * | 7/2001 | Alapuranen et al. | 370/343 |
| 6,324,559 B1 * | 11/2001 | Hellberg | 708/321 |
| 6,483,923 B1 * | 11/2002 | Marash | 381/92 |
| 6,504,579 B1 * | 1/2003 | Scherrer | 348/667 |
| 6,535,552 B1 | 3/2003 | Pessoa | |
| 6,577,670 B1 * | 6/2003 | Roberts | 375/133 |
| 6,704,438 B1 * | 3/2004 | Alexandru | 382/128 |
| 6,714,587 B1 * | 3/2004 | Van Houtum et al. | 375/220 |

(Continued)

FOREIGN PATENT DOCUMENTS

EP    0 982 861 A2    3/2000

(Continued)

OTHER PUBLICATIONS

The MathWorks Inc., Signal Processing Toolbox, 1988-1998, The MathWorks Inc., pp. vi-ix.*

(Continued)

*Primary Examiner* — David C. Payne
*Assistant Examiner* — Linda Wong
(74) *Attorney, Agent, or Firm* — Potomac Patent Group PLLC

(57) ABSTRACT

A receiver comprises an adaptive filter having an input for a digitized input signal, means for storing a pre-designed filter characteristic, means for analyzing a digital representation of the input signal to determine a desired position of the filter characteristic to match the system requirements, and means for adapting the stored pre-designed filter characteristic in the frequency domain and/or the time domain to match the system requirements and for transforming the adapted filter characteristic to the time domain to update coefficients for the adaptive filter and for loading updated coefficients into adaptive filter. The updating of the coefficients may be done periodically. The adaptation may be one or more of adjusting bandwidth, frequency shift and, in the case of a bandpass characteristic, superimposing characteristics.

15 Claims, 8 Drawing Sheets

U.S. PATENT DOCUMENTS

| | | | |
|---|---|---|---|
| 6,804,313 B2* | 10/2004 | Skafidas et al. | 375/350 |
| 6,959,056 B2* | 10/2005 | Yeap et al. | 375/346 |
| 6,990,061 B2* | 1/2006 | Deneire et al. | 370/210 |
| 2002/0021715 A1* | 2/2002 | Matheus et al. | 370/480 |
| 2002/0097341 A1* | 7/2002 | Patel et al. | 348/614 |
| 2002/0168001 A1* | 11/2002 | Ramsey | 375/232 |
| 2003/0007554 A1* | 1/2003 | Birru | 375/233 |
| 2004/0120249 A1* | 6/2004 | Blasco Claret et al. | 370/208 |

FOREIGN PATENT DOCUMENTS

| | | |
|---|---|---|
| JP | 6-326559 A | 11/1994 |
| JP | 2000-312167 A | 11/2000 |
| JP | 2001-7746 A | 1/2001 |
| JP | 2001-144636 A | 5/2001 |
| WO | WO 03005581 A1 | 1/2003 |

OTHER PUBLICATIONS

Madisetti et al, The Digital Signal PRocessing Handbook, 1998, CRC Press LLC, pp. 1-7-1-10 and pp. 11-32-11-35.*

"Adaptive Digital Signal Processing JAVA Teaching Tool" by M. Hartneck and R.W. Stewart, submitted ot IEEE Transactionso n Education-Special CDROM Issue, Nov. 1999, also available on the internet at: hhtp://www.spd.eee.strath.ac.uk/users/bob/adaptivejava/begin.htm.

Appelquist, P., "HD-Divine, a Scandinavian terrestrial HDTV project," EBU Technical Review, Summer 1993, Apr. 1993, pp. 16-19.

Garcia, R.F., "FAM Based Controller as Kalman Filter Alternative Applied to Ship's Dynamic Positioning Control," Proceedings of the Third IEEE Conference on Control Applications, Glasgow, United Kingdom, Aug. 24-26, 1994, pp. 845-850.

Treichler J R et al. "Convergence Rate Limitations in Certain Frequency-domain Adaptive Filters" (International Conference on Acoustics, Speech and Signal Processing ICA-SSP), 89 vol. 2, May 23-26, 1989, pp. 960-963.

* cited by examiner

RECEIVER HAVING AN ADAPTIVE FILTER AND METHOD OF OPTIMISING THE FILTER

TECHNICAL FIELD

The present invention relates to a receiver having an adaptive filter and to a method of adapting and optimising the characteristics of the adaptive filter. The receiver has particular, but not exclusive, application to receiving broadband OFDM/CDMA signals in the ISM band.

The present invention relates to a receiver having an adaptive filter and to a method of adapting and optimising the characteristics of the adaptive filter. The receiver has particular, but not exclusive, application to receiving broadband OFDM/CDMA signals in the ISM band.

BACKGROUND INFORMATION

Many receivers use some form of digital filtering for a variety of purposes including channel selection, channel rejection and interference rejection. The specific filtering requirements for individual scenarios are generally dynamic, for example for channel or interference rejection, and in these situations a dynamic filter allows optimum performance, for example how well an interferer is rejected, for the least complexity and/or power consumption.

In a broadband OFDM/CDMA system operating in the ISM band there are many sources of interference, one of which is narrowband frequency hopping systems. Adaptive filters can be used in CDMA applications where CDMA signals are interfered with by a narrowband jammer. In an article "Adaptive Digital Signal Processing JAVA Teaching Tool" by M. Hartneck and R. W. Stewart, submitted to IEEE Transactions on Education-Special CDROM Issue, November 1999, also available on the internet at: http://www.sp-d.eee.strath.ac.uk/users/bob/adaptivejava/begin.htm, there is disclosed an example of CDMA interference suppression in which if a broadband (stochastic) signal has interference from a narrowband (periodic) source a prediction architecture can be used to attempt to find correlation between an output y(k) of an adaptive filter and an input signal which has been fed forward from a delayed input of the adaptive filter. By taking the difference between the signals, viz. d(k)−y(k), the narrowband signal is attenuated and it is found that an output signal e(k) is approximately equal to the signal applied by a data source to the transmission channel. As a generality adaptive filters use error calculations in order to make minor adjustments to the filter coefficients. As the demands for high performance filtering grow there is an attendant problem of complexity and increased power consumption.

BRIEF SUMMARY

An object of the present invention is to provide an adaptive filter which can achieve a high performance coupled with a less complex structure and a lower power consumption than known adaptive filters.

According to one aspect of the present invention there is provided a method of dynamically adapting a digital filter characteristic, comprising storing a predetermined frequency representation of the filter, analysing an input signal, adapting the filter characteristic to match the system requirements, transforming a frequency domain representation of the adapted filter characteristic to the time domain, and calculating new filter coefficients to effect the adaption of the filter characteristics.

According to a second aspect of the present invention there is provided a receiver comprising an adaptive filter having an input for a digitised input signal, means for storing a pre-designed filter characteristic, means for analysing a digital representation of the input signal to determine a desired position of the filter characteristic to match the system requirements, means for adapting the stored pre-designed filter characteristic to match the system requirements, and means for transforming the adapted filter characteristic to the time domain to update coefficients for the adaptive filter and for loading updated coefficients into adaptive filter.

The adaptation of the filter characteristic may be effected in the frequency domain, for example by moving filter taps to the left or right and then doing an IFFT, in the time domain, for example by multiplying all time domain taps by a sine wave of the desired shift frequency, or in a combination of both frequency and time domains.

BRIEF DESCRIPTION OF THE SEVERAL VIEWS OF THE DRAWINGS

The present invention will now be described, by way of example, with reference to the accompanying drawings, wherein.

In the drawings the same reference numerals have been used to indicate corresponding features.

DETAILED DESCRIPTION

Figure 1:
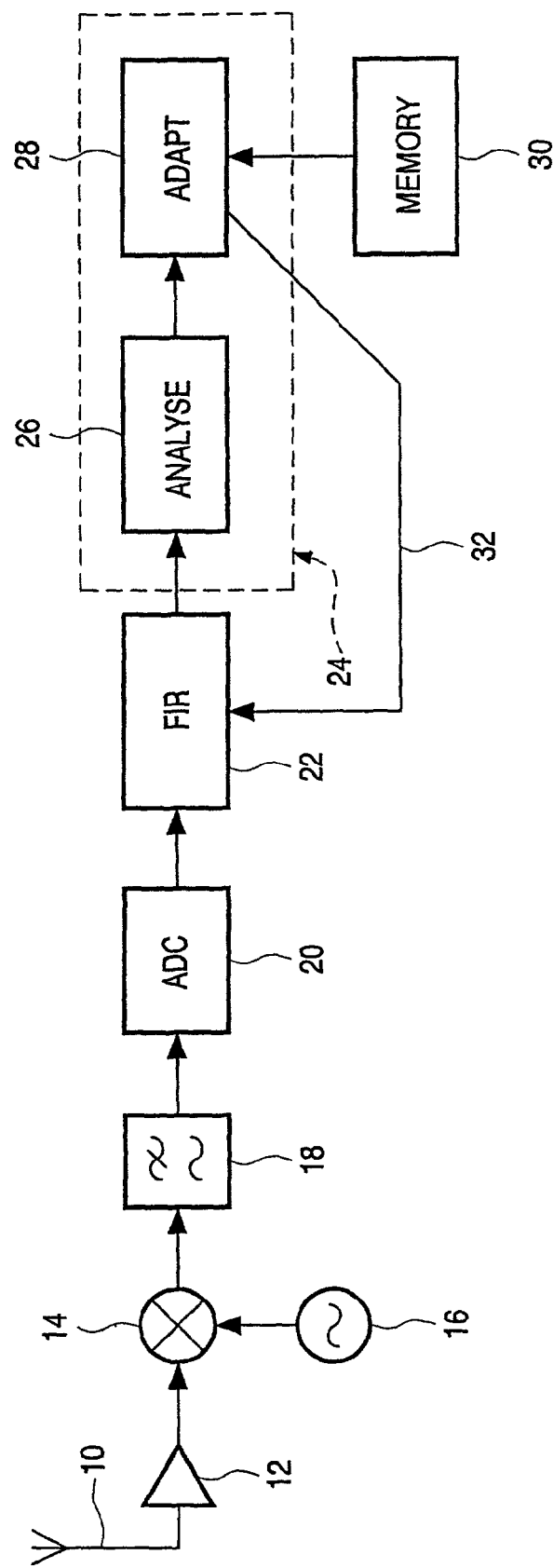
FIG. 1 is a block schematic diagram of a receiver made in accordance with the present invention.

Referring to FIG. 1, the receiver comprises an antenna 10 connected by way of a RF amplifier 12 to a first input of a mixer 14. A local oscillator 16 for mixing the received signal down to baseband is coupled to a second input of the mixer 14. A low pass filter 18 selects the wanted products of mixing from the signals at the output of the mixer 14. An analog-to-digital converter (ADC) 20 which may be implemented as a sigma delta modulator is coupled to the low pass filter 18. A FIR filter 22 which may be implemented as a field programmable gate array, an application specific integrated circuit (asic) or a Digital Signal Processor (DSP) with FIR filter is coupled to an output of the ADC 20. A DSP 24 is coupled to the output of the FIR filter 22 in order to analyse the received signal and to adapt the filter characteristics accordingly. In the illustrated embodiment of the DSP 24 it comprises a first block 26 which serves to analyse the input signal, that is, to find the position of interference and its severity. A second stage 28 manipulates the original FIR filter in the frequency domain and converts it from the frequency domain to the time domain to obtain the FIR coefficients.

A frequency domain version of the original FIR filter is stored in a memory 30 which is coupled to the second stage 28. The second stage 28 is coupled by a line 32 to the FIR filter 22 to enable new coefficients to be loaded with the FIR filter 22. The calculation and loading of new coefficients may be periodic, for example once every N communication frames to reduce the burden on the DSP 24.

In operation of the receiver, a pre-designed frequency representation of the filter is stored in the memory 30 and the characteristics are adapted as a result of analysing the input signal in the first stage 26 to match those required by the system. The adaptation of the filter characteristic can be effected (a) in the frequency domain by shifting frequency domain filter taps left or right in the frequency domain and then doing an IFFT, (b) in the time domain by multiplying time domain filter taps by a sine wave of the required frequency, or (c) a combination of both by initially adapting the characteristic in the frequency domain and manipulating the characteristic further in the time domain.

Although the frequency domain and the time domain methods are equivalent, the frequency domain method has an inherent granularity, that is the frequency of the filter can be shifted by, for example (100, 200, 300, . . . 1300, 1400 . . . N*100) Hz, whereas the time domain method enables a precise frequency shift of say 1 MHz to be effected.

Once adapted, the frequency domain representation of the filter is transformed back to the time domain in order to obtain the new coefficients or tap weightings which are loaded into the FIR filter 22 by way of the line 32.

Figure 2:
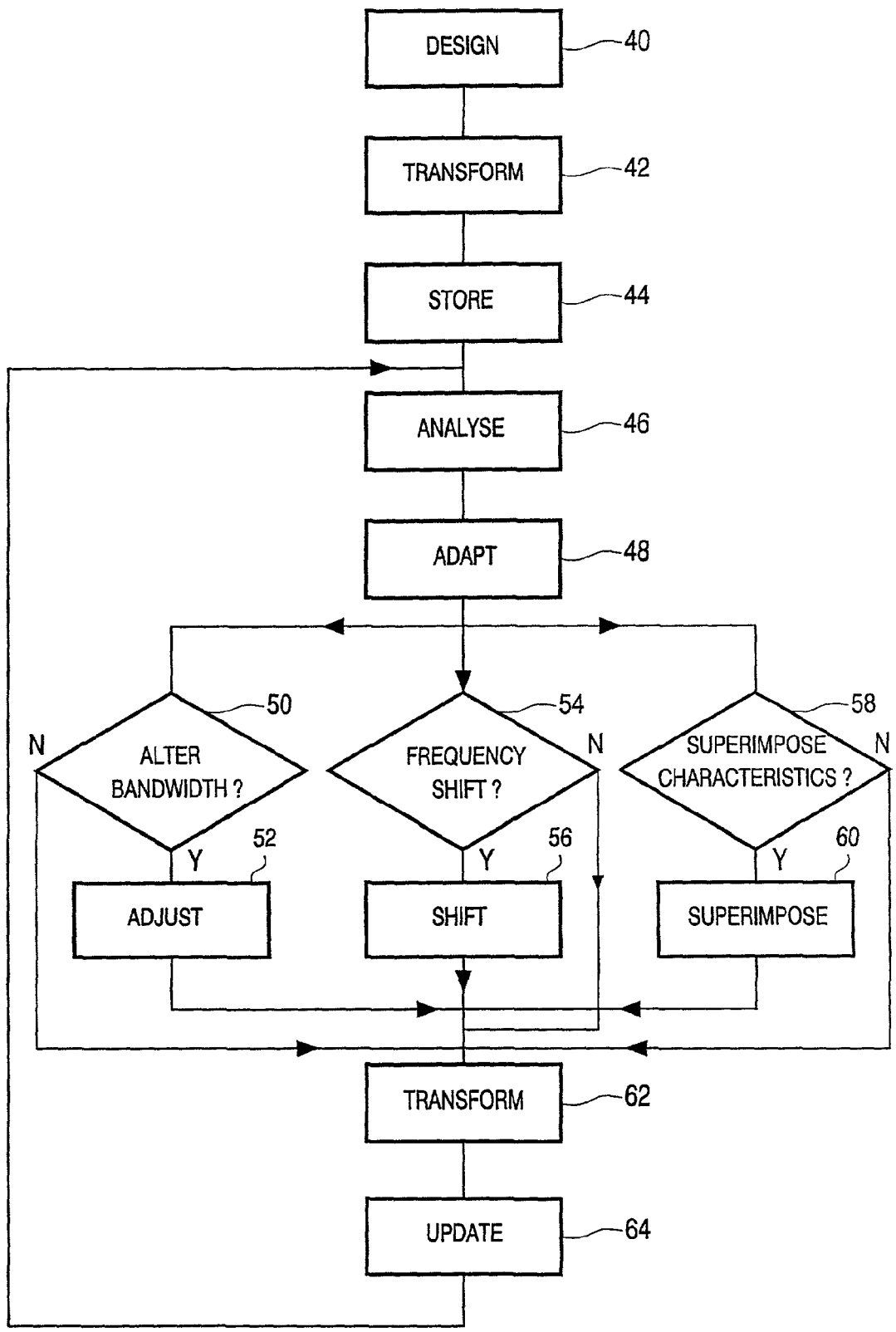
FIG. 2 is a flow chart relating to a method of adapting and optimising the characteristics of a digital filter used in the receiver shown in FIG. 1, FIGS. 3, 4 and 5 respectively show a bandstop filter characteristic stored in a memory of the receiver and the same characteristic shifted to the left and to the right of the position shown in FIG. 3, FIGS. 6 and 7 respectively show a widened version of the original bandstop filter characteristic and the same characteristic shifted to the right of the position shown in FIG. 6, and FIGS. 8 to 13 show a number of bandpass filter characteristics.
Figure 3:
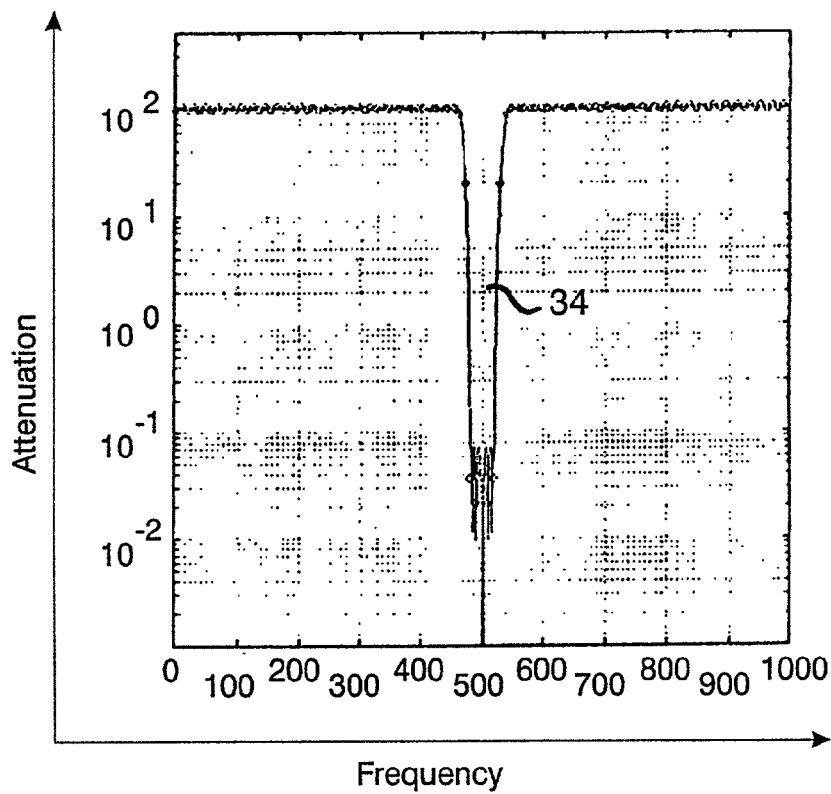
Figure 4:
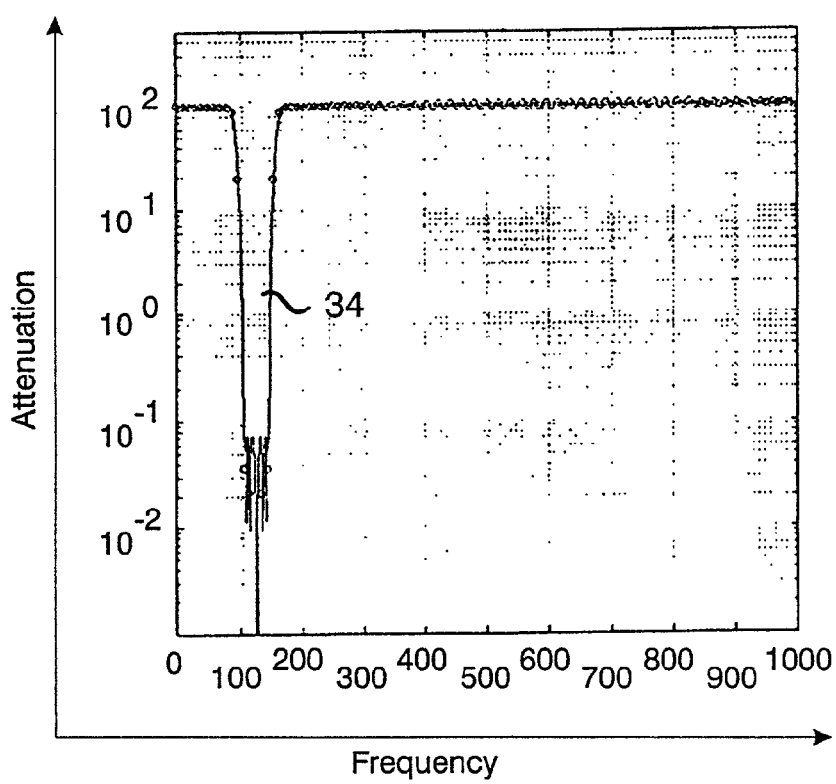
Figure 5:
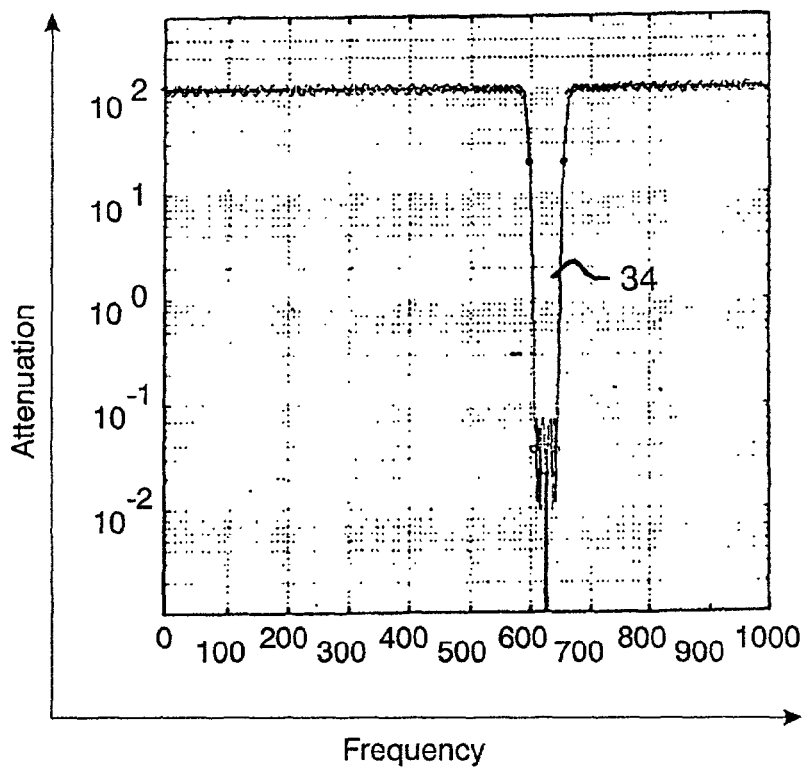

Before describing the flow chart in FIG. 2 the understanding of the process will be better understood by considering FIGS. 3 to 5. In these figures, the abscissa represents frequency and the ordinate attenuation of the bandstop filter having 104 taps. FIG. 3 shows the pre-designed frequency representation of the FIR filter 22 having a notch 34 dimensioned to block out a narrowband interferer. The filter characteristic is stored in the memory 30. Such a filter is useful for a broadband of OFDM/CDMA system which is operating in the ISM band. In the ISM band one of the sources of interference is narrowband frequency hopping systems. In order to block out a frequency hopping interferer it is necessary to position the filter characteristic wherever necessary so that the notch 34 can block out this narrowband signal.

In operation the DSP 24 determines the position of the interferer and manipulates the filter 22 so that the notch 34 is shifted to block the interferer. FIGS. 4 and 5 show different positions to which the notch 34 has been shifted whilst leaving the shape of the notch unaltered.

In many cases the receiver can predict where the interferer will frequency hop to because the hopping algorithms are known and can therefore act pro-actively rather than reactively and insodoing make further performance gains.

Referring to FIG. 2, the flow chart begins with a block 40 which relates to the process of designing a FIR filter using a filter design package. Block 42 relates to the process of transforming the impulse response to the frequency domain. Block 44 relates to permanently storing the frequency domain samples in the memory 30 of the receiver. Block 46 relates to the receiver measuring the required filter characteristics by analysing the received signal. Block 48 denotes the receiver adapting the characteristics of the stored filter to match those required. The characteristics which may be altered are (1) bandwidth which is adjusted by reducing or increasing the number of samples in the stored frequency domain characteristic; (2) frequency shift which in the frequency domain is adjusted by shifting the samples of the stored frequency domain characteristic left or right or in the time domain by multiplying time domain filter taps using a sine wave of the desired frequency; and (3) superimposed characteristics, which as will be described later, applies only to a bandpass filter, and which is realised by adding together individual frequency domain characteristics.

In block 50 a check is made to see if bandwidth has to be altered, and if so (Y) then block 52 denotes adjusting the bandwidth.

In block 54 a check is made to see if a frequency shift is required and if so (Y) then in block 56 the frequency is shifted.

In block 58 a check is made to see if characteristics are to be superimposed and if so (Y) then this is carried out in block 60.

A negative output (N) from each of the blocks 50, 54 and 58 is supplied together with outputs from the blocks 52, 56, 60 to a block 62 which denotes transforming the adjusted frequency domain representation back to the time domain using a FFT which is equal in size to the number of sample points. Block 64 relates to the receiver updating the FIR filters coefficients with the result from the block 62. The new coefficients may be calculated continuously or periodically, for example once every N communication frames.

The flow chart thereafter returns to the block 46 whenever an update is required.

Figure 6:
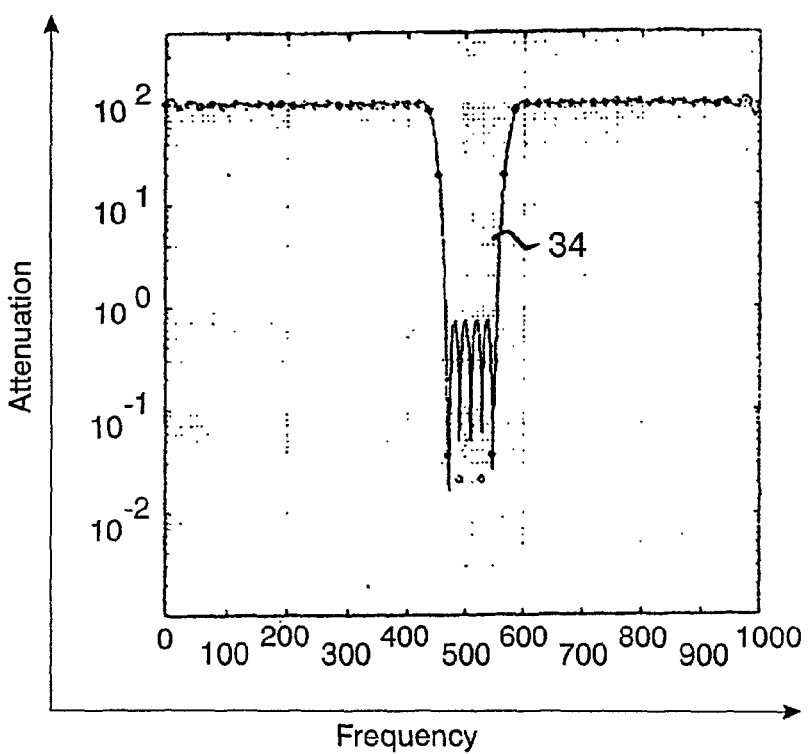
Figure 7:
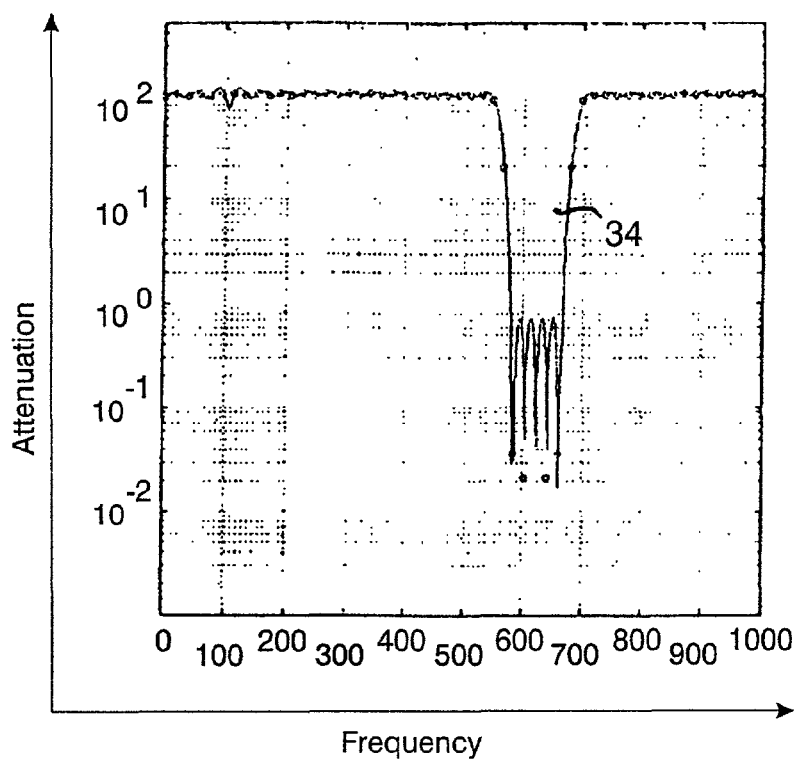

Referring now to FIGS. 6 and 7, the bandstop filter is a widened version of the original filter which is less complex and less power hungry, having only 60 taps compared to 104 taps in FIGS. 3, 4 and 5. FIG. 7 shows the notch 34 shifted to the right from the position shown in FIG. 6.

The teachings of the present invention can be applied to a bandpass filter having application to purposes such as channel selection in say a base station.

Referring to FIGS. 8 to 13, the abscissa represents frequency and the ordinate represents power.

Figure 8:
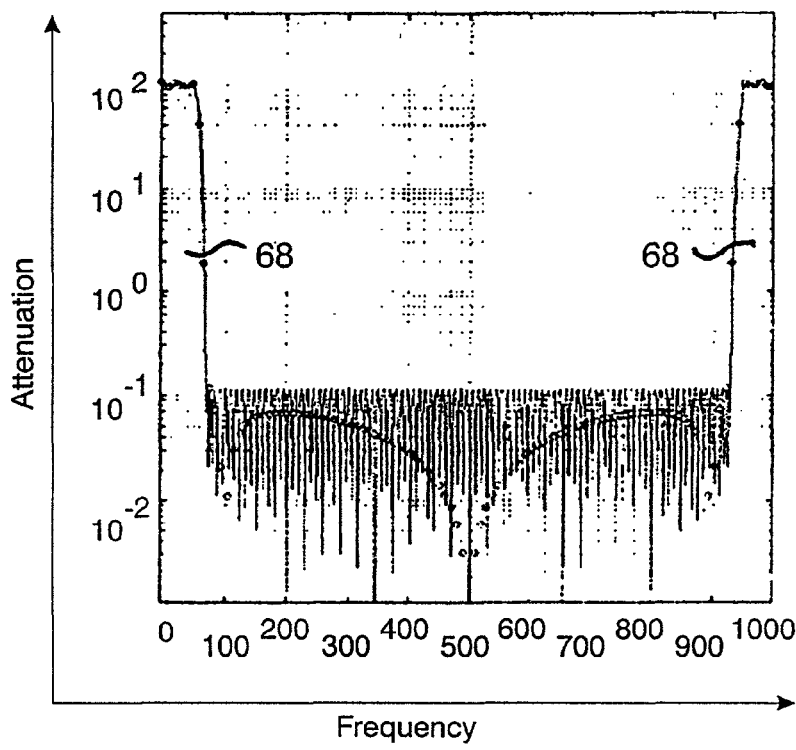

FIG. 8 shows an original 104 tap filter designed using a filter designer program. The passband is shown by the passbands 68.

Figure 9:
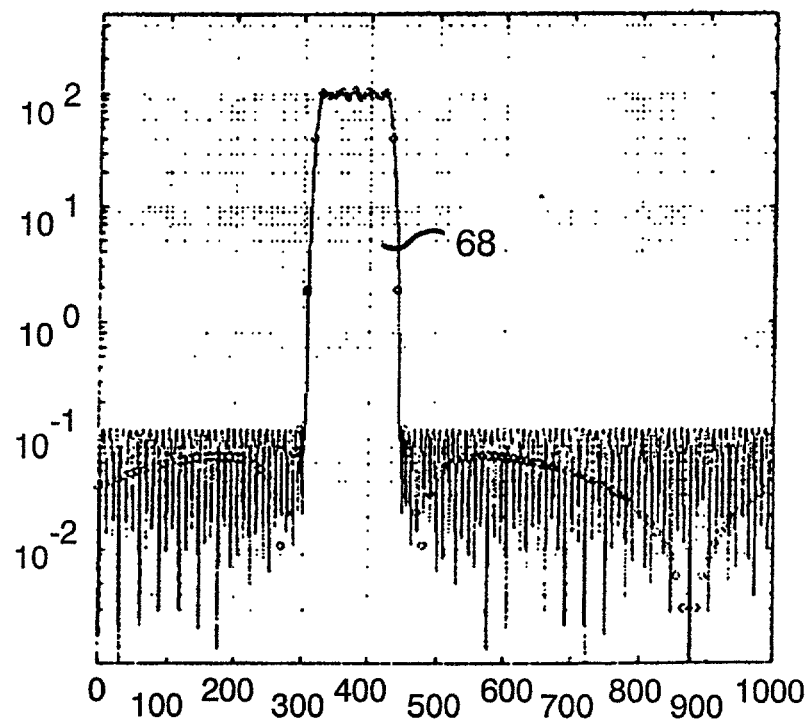

FIG. 9 illustrates the filter characteristic of FIG. 8 which has been shifted in frequency so that the passband 68 selects the desired correct channel.

Figure 10:
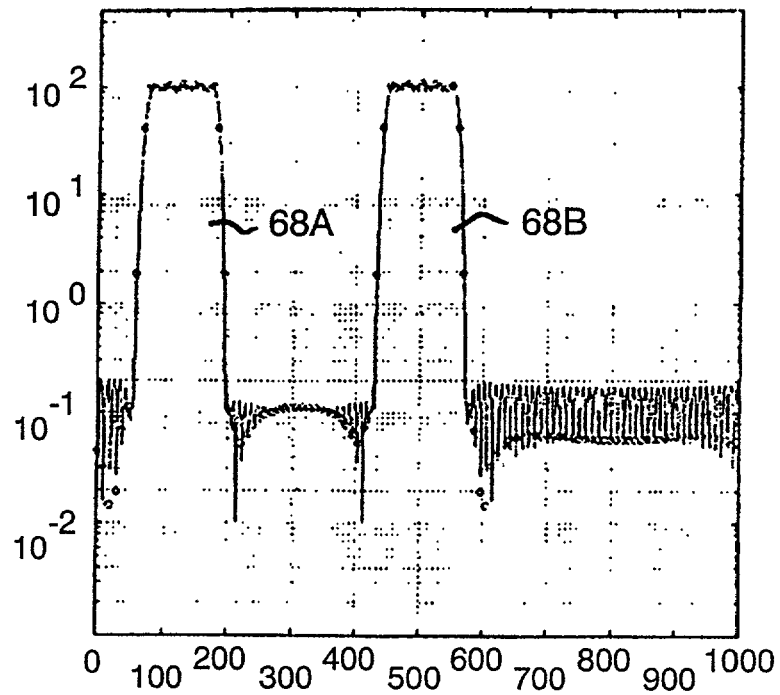

FIG. 10 shows the filter characteristic of a 104 tap filter which is formed by two superimposed versions which provide two passbands 68A, 68B allowing two channels to pass.

Figure 11:
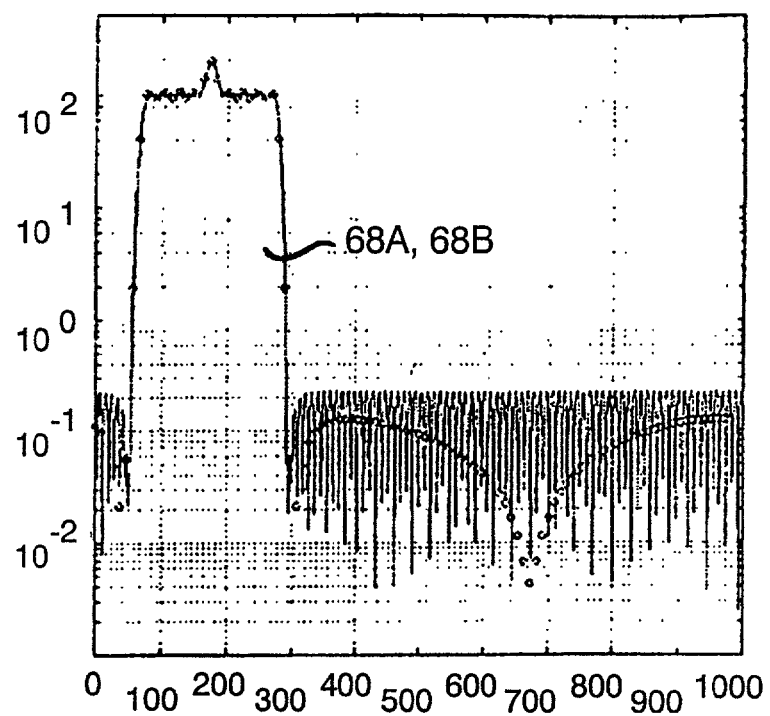

FIG. 11 illustrates the filter characteristic of a 104 tap filter formed by arranging the passbands 68A, 68B adjacent to provide a wider channel having a high roll off.

Figure 12:
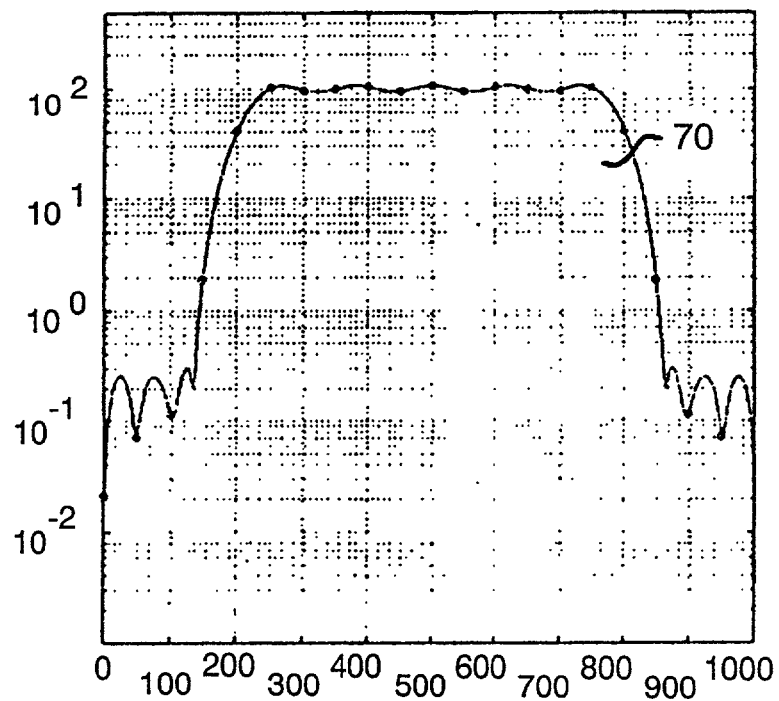

FIG. 12 illustrates a filter characteristic of a 19 tap filter in which the passband 70 has been stretched compared to those of FIGS. 8 to 11 and has a low rolloff.

Figure 13:
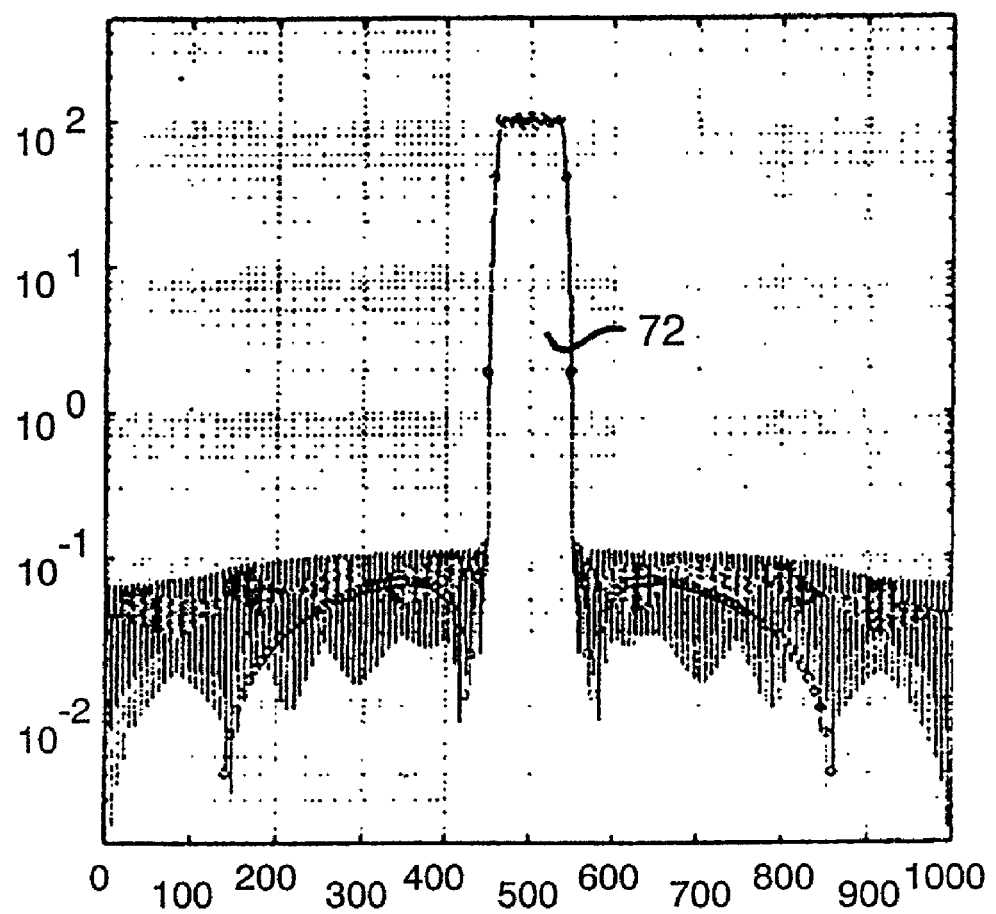

Lastly, FIG. 13 illustrates a filter characteristic of a 142 tap filter in which the passband 72 is narrowed compared to that of FIG. 9.

In the present specification and claims the word "a" and "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the design, manufacture and use of receivers having adaptive filters and component parts therefor and which may be used instead of or in addition to features already described herein.

What is claimed is:

1. A method of dynamically adapting a digital filter characteristic, the method comprising:

storing a frequency domain representation of the filter characteristic;

analyzing an input signal to determine a required filter characteristic based on a frequency of a narrowband interfering signal included in the input signal;

adapting the frequency domain representation to match the required filter characteristic;

transforming the adapted frequency domain representation to a time domain so as to obtain filter coefficients relating to the required filter characteristic; and applying the filter coefficients to effect the adaptation of the filter characteristic, wherein adapting the frequency domain representation to match the required filter characteristic includes at least one of:

altering a bandwidth of the frequency domain representation by reducing or increasing a number of samples in the frequency domain representation according to the frequency of the narrowband interfering signal; and altering a frequency of the frequency domain representation by shifting samples of the frequency domain representation to a lower or higher frequency according to the frequency of the narrowband interfering signal.

2. The method as claimed in claim 1 wherein the filter characteristic is further adapted in the time domain.

3. The method as claimed in claim 1 wherein said filter coefficients are periodically calculated.

4. The method as claimed in claim 1 wherein the filter characteristic includes a bandstop interference blocking characteristic and the adapting includes shifting the filter characteristic to block the interfering signal.

5. A receiver, comprising:
an adaptive filter;
an input to receive a digitized input signal;
a memory to store a frequency domain representation of a filter characteristic of the filter; and
a digital signal processor coupled to the adaptive filter and having a first stage and a second stage, the first stage being configured to receive and to analyze a digital representation of the input signal to determine a required filter characteristic based on a frequency of a narrowband interfering signal included in the input signal, and the second stage being configured to adapt the frequency domain representation to match the required filter characteristic and to transform the adapted frequency domain representation into a time domain so as to obtain filter coefficients relating to the required filter characteristic, wherein the second stage is configured to adapt the frequency domain representation by at least one of:

altering a bandwidth of the frequency domain representation by reducing or increasing a number of samples in the frequency domain representation according to the frequency of the narrowband interfering signal; and altering a frequency of the frequency domain representation by shifting samples of the frequency domain representation to a lower or higher frequency according to the frequency of the narrowband interfering signal.

6. The receiver as claimed in claim 5 wherein the second stage of the digital signal processor is configured to further adapt the filter characteristic in the time domain.

7. The receiver as claimed in claim 5, wherein the digital signal processor is configured to periodically calculate new ones of said filter coefficients.

8. The receiver as claimed in claim 5, wherein the filter characteristic includes a bandstop interference blocking characteristic, and the second stage is configured to shift the filter characteristic to block the interfering signal.

9. A method of dynamically adapting a digital filter characteristic, the method comprising:
storing a frequency domain representation of the filter characteristic;
analyzing, under control of a digital signal processor, an input signal to determine a required filter characteristic based on a frequency of a narrowband interfering signal included in the input signal;
adapting, under control of the digital signal processor, the frequency domain representation to match the required filter characteristic;
transforming, under control of the digital signal processor, the adapted frequency domain representation to a time domain so as to obtain filter coefficients relating to the required filter characteristic; and
applying the filter coefficients to effect the adaptation of the filter characteristic, wherein adapting the frequency domain representation to match the required filter characteristic includes at least one of:
altering a bandwidth of the frequency domain representation by reducing or increasing a number of samples in the frequency domain representation according to the frequency of the narrowband interfering signal; and
altering a frequency of the frequency domain representation by shifting samples of the frequency domain representation to a lower or higher frequency according to the frequency of the narrowband interfering signal.

10. The method of claim 9 wherein the filter characteristic includes a bandstop interference blocking characteristic and the adapting includes shifting the filter characteristic to block the interfering signal.

11. The method of claim 9, further comprising prestoring a hopping sequence to facilitate the adapting.

12. The method of claim 9 wherein the filter characteristic includes a bandpass characteristic and the adapting includes shifting the filter characteristic to select a required channel.

13. The method of claim 9 wherein the adapting the frequency domain representation to match the required filter characteristic comprises:
selectively altering a bandwidth of the frequency domain representation by reducing or increasing a number of samples in the frequency domain representation; and
selectively altering a frequency of the frequency domain representation by shifting samples of the frequency domain representation to a lower or higher frequency.

14. The receiver of claim 5 wherein the second stage is configured to:
selectively reduce or increase a number of samples in the frequency domain representation; and
selectively shift samples of the frequency domain representation to a lower or higher frequency.

15. The method of claim 1 wherein the adapting the frequency domain representation to match the required filter characteristic comprises:
selectively altering a bandwidth of the frequency domain representation by reducing or increasing a number of samples in the frequency domain representation; and
selectively altering a frequency of the frequency domain representation by shifting samples of the frequency domain representation to a lower or higher frequency.

* * * * *